(12) United States Patent
Wang

(10) Patent No.: US 12,710,467 B2
(45) Date of Patent: Aug. 18, 2026

(54) WAFER TESTER AND WAFER TESTING METHOD AND SYSTEM

(71) Applicant: NANYA TECHNOLOGY CORPORATION, New Taipei City (TW)

(72) Inventor: Ching-Chung Wang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 408 days.

(21) Appl. No.: 17/813,934

(22) Filed: Jul. 21, 2022

(65) Prior Publication Data

US 2024/0027518 A1 Jan. 25, 2024

(51) Int. Cl.
*G01R 31/28* (2006.01)

(52) U.S. Cl.
CPC ..... *G01R 31/2834* (2013.01); *G01R 31/2831* (2013.01)

(58) Field of Classification Search
CPC ............ G01R 31/2834; G01R 31/2831; G01R 31/2894; G01R 31/2601; G01R 1/0416; G01R 31/28; G01R 31/2832; G01R 31/31718; G01R 31/31908; G01R 31/31912; G01R 1/0491; G01R 31/26; G01R 31/2851; G01R 31/2868; G01R 31/287; G01R 31/318511; G01R 1/06761; G01R 31/31903; G06F 11/2247; G06F 11/2273; G06F 11/2205; G06F 11/263; H01L 22/20; H01L 22/00
See application file for complete search history.

(56) References Cited

U.S. PATENT DOCUMENTS 7,162,386 B2 * 1/2007 Dorough ............ G01R 31/2831 702/83
7,230,442 B2 * 6/2007 Muller .................. G11C 29/56 324/762.01
7,319,940 B2 * 1/2008 Ishizuka ........... G01R 31/2834 702/187
7,543,200 B2 * 6/2009 Pramanick ....... G01R 31/31907 714/724
2002/0152046 A1 * 10/2002 Velichko ............ G01R 31/2834 714/E11.154
2010/0156434 A1 * 6/2010 Okino ............... H01L 21/67748 324/555

(Continued)

FOREIGN PATENT DOCUMENTS

CN 1372355 A * 10/2002 ......... G01R 1/06761
CN 103678529 B 1/2017

(Continued)

*Primary Examiner* — Catherine T. Rastovski
*Assistant Examiner* — Eric Sebastian Von Wald
(74) *Attorney, Agent, or Firm* — CKC & Partners Co., LLC

(57) ABSTRACT

The present disclosure provides a wafer testing method, including: assigning multiple testing programs to multiple wafers, wherein each of the testing programs includes testing algorithms configured to measure parameters of the wafers; setting multiple sets of testing conditions for the testing programs; and testing at least one of the wafers by executing a corresponding one of the testing programs according to a corresponding one of the testing conditions.

13 Claims, 4 Drawing Sheets

(56) References Cited

U.S. PATENT DOCUMENTS

2011/0275170 A1* 11/2011 Van Wagenen .. G01R 31/31907
702/117
2017/0184663 A1* 6/2017 Wu .................... G01R 31/2891
2020/0088828 A1* 3/2020 Kurebayashi ...... G01R 31/2889
2021/0072308 A1* 3/2021 Hayasaka .......... G01R 31/2887
2022/0004096 A1* 1/2022 Volkovich ........... G03F 7/70525
2023/0384365 A1* 11/2023 Kim ....................... G01K 3/005

FOREIGN PATENT DOCUMENTS

CN 109741784 A * 5/2019
CN 114152858 A * 3/2022 ......... G01R 31/2601
TW I665457 B 7/2019
TW I666695 B 7/2019

* cited by examiner

WAFER TESTER AND WAFER TESTING METHOD AND SYSTEM

FIELD OF INVENTION

The present disclosure relates to a wafer testing method, a wafer tester, and a wafer testing system. More particularly, the present disclosure relates to a wafer testing method, a wafer tester, and a wafer testing system configured to assign multiple testing programs to multiple wafers.

DESCRIPTION OF RELATED ART

In traditional wafer testing approaches, a tester can execute only one testing program at a time to test a whole batch of wafers, and plenty of time is spent on measuring unnecessary parameters or testing unnecessary wafers. Thus, the efficiency is low. In addition, long testing time also damages to the pins of probe card, which further results in incorrect test results.

SUMMARY

The present disclosure provides a wafer testing method, including: assigning multiple testing programs to multiple wafers, wherein each of the testing programs includes testing algorithms configured to measure parameters of the wafers; setting multiple sets of testing conditions for the testing programs; and testing at least one of the wafers by executing a corresponding one of the testing programs according to a corresponding one of the testing conditions.

The present disclosure also provides a wafer tester, including a non-transitory computer-readable medium, a processor, and a test head. The non-transitory computer-readable medium is configured to store multiple testing programs, multiple sets of testing conditions, and multiple sets of testing sites. The processor is coupled to the non-transitory computer-readable medium. The test head is coupled to the processor. In response to the processor executing the testing programs, the test head is configured to test multiple wafers according to the testing programs, the sets of testing conditions, and the testing sites. Each of the testing programs includes testing algorithms configured to measure parameters of the wafers. Each of the sets of testing conditions corresponds to one of the testing programs. Each of the sets of testing sites indicates at least one die of one of the wafers.

The present disclosure also provides a wafer testing system, including a tester and a prober. The tester includes a non-transitory computer-readable medium, a processor, and a test head. The non-transitory computer-readable medium is configured to store multiple testing programs, multiple sets of testing conditions, and multiple sets of testing sites. The processor is coupled to the non-transitory computer-readable medium and configured to assign the testing programs to multiple wafers. The prober includes a probe card. The probe card is coupled to the test head and configured to create an electrical path between the test head and at least one of the wafers. The test head is configured to test the at least one of the wafers through the probe card according to a corresponding one of the testing programs. Each of the testing programs includes multiple testing algorithms configured to measure parameters of the wafers. Each of the sets of testing conditions corresponds to one of the testing programs. Each of the sets of testing sites indicates at least one die of one of the wafers.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
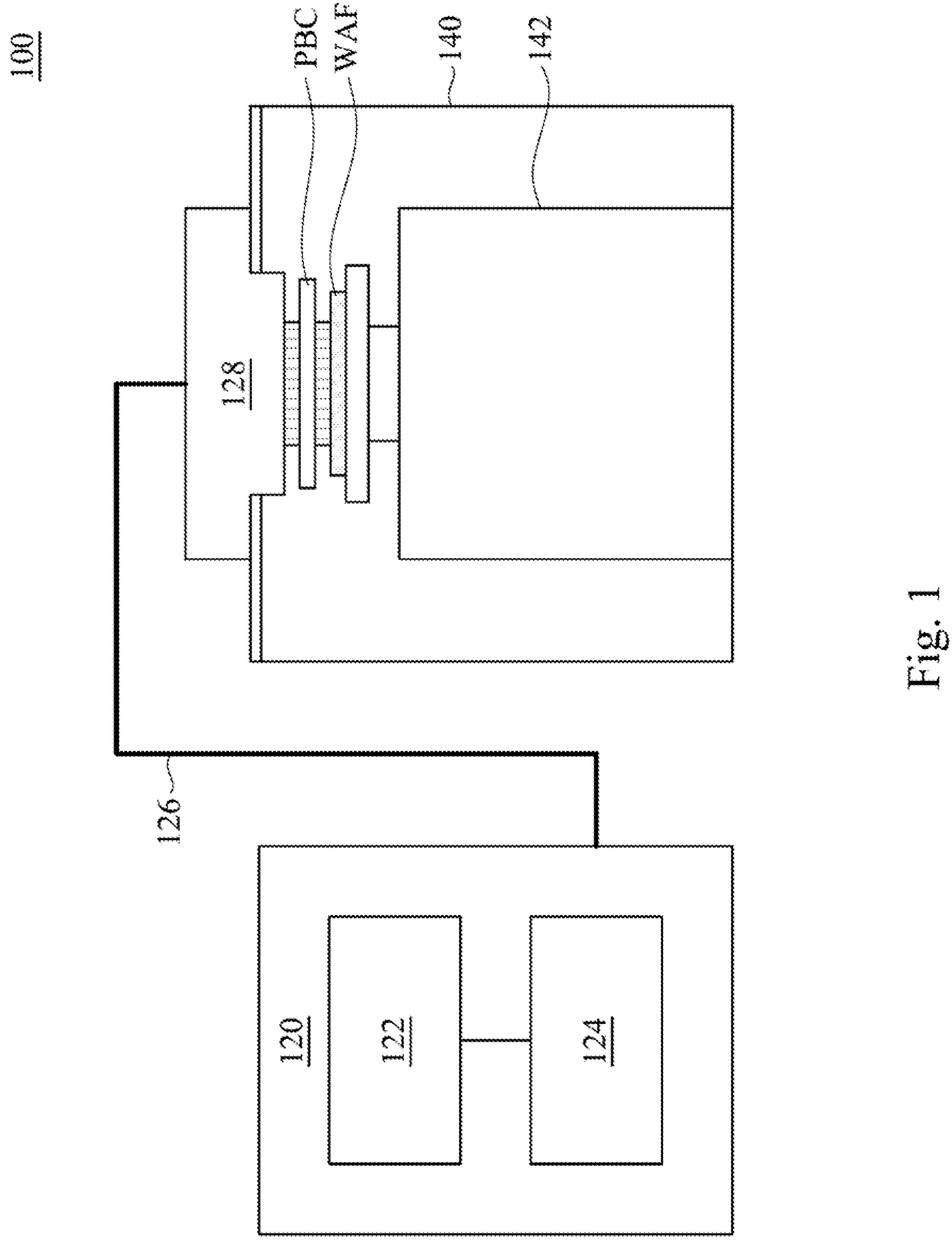
FIG. 1 is a diagram of a wafer testing system in accordance with some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

The present disclosure provides a wafer testing system. FIG. 1 illustrates a diagram of a wafer testing system 100 in accordance with some embodiments of the present disclosure. The wafer testing system 100 includes a tester 120 and a prober 140. The tester 120 is configured to execute testing programs and use a test head 128 to measure parameters of a wafer WAF placed in the prober 140. The prober 140 is configured to hold a probe card PBC in place and move the wafer WAF to contact the probe card PBC in order to perform electrical testing.

The tester 120 includes a non-transitory computer-readable medium 122, a processor 124, a cable 126, and the test head 128. The non-transitory computer-readable medium 122 is configured to store multiple testing programs, sets of testing conditions, and sets of testing sites. The processor 124 is coupled to the non-transitory computer-readable medium 122 and configured to execute the testing programs according to the testing conditions and testing sites. The test head 128 is coupled to the processor 124 through the cable 126 and is configured to test the wafer WAF according to the testing programs, testing conditions, and testing sites when the processor executes the testing programs.

In some embodiments, each of the testing programs stored in the non-transitory computer-readable medium 122 includes multiple testing algorithms configured to measure various parameters or characteristics of the wafer WAF, such as current, voltage, resistance, capacitance, etc.

In some embodiments, the sets of testing conditions are the conditions under which the processor 124 executes the testing programs. In some embodiments, each of the sets of testing conditions that are stored in the non-transitory computer-readable medium 122 corresponds to one of the testing programs stored in the non-transitory computer-readable medium 122. In some embodiments, each set of the testing conditions indicates the input current and/or voltage, the pad(s) of the probe card PBC, and/or other conditions that decide the operation of the test head 128 and the probe card PBC.

In some embodiments, the sets of testing sites are configured to indicate at least one die of the wafer WAF. In other words, the sets of testing sites are configured to show which dies of the wafer WAF should be tested. In some embodiments, the wafer testing system 100 is configured to test multiple wafers, such as a batch of wafers stored in the prober 140 or a wafer box, and each set of testing sites corresponds to one of the wafers and is configured to indicate at least one die of such wafer that has to be tested.

In some embodiments, the sets of testing sites are stored in the non-transitory computer-readable medium 122 as sets of coordinates indicating the locations of dies to be tested. In some embodiments, the sets of testing sites are implemented as multiple maps or diagrams illustrating the dies of the wafer WAF that have to be tested.

In some embodiments, the non-transitory computer-readable medium 122 is a memory, such as random access memory (RAM), read only memory (ROM), or other device used for storing information and/or data.

In some embodiments, the processor 124 is a central processing unit (CPU), graphic processing unit (GPU), or other device used for computing, processing information and/or data, or executing programs.

The prober 140 includes a stand 142 and the probe card PBC. The stand 142 is configured to move and fix the wafer WAF so that the probe card PBC can contact the wafer WAF at the right position, and the test head 128 can test the wafer WAF through the probe card PBC.

The probe card PBS is configured as an interface between the test head 128 and the wafer WAF and is configured to create an electrical path between the test head 128 and the wafer WAF.

In some embodiments, the probe card PBC includes multiple pins configured to contact the wafer WAF and measure parameters of the wafer WAF.

In some embodiments, the wafer testing system 100 further includes a wafer box (not shown in FIG. 1) outside the prober 142 and connected to the prober 140. The wafer box is configured to store a batch of wafers, and the prober 140 is configured to move the wafers from the wafer box to the stand 142, or vice versa. In some embodiments, the prober 140 further includes one or more robotic arms (not shown in FIG. 1) configured to move the wafers between the wafer box and the stand 142.

In some embodiments, the wafer box discussed above is arranged inside the prober 140, and multiple wafers to be tested are stored in the prober 140.

The following paragraphs discuss the operation of the wafer testing system 100 in detail.

First, the processor 124 retrieves the testing programs stored in the non-transitory computer-readable medium 122 and assigns the testing programs to the wafers.

In some embodiments, the processor 124 assigns each of the testing programs to one of a batch of wafers. In other words, a one-to-one corresponding relationship exists between the testing programs and the wafers. In alternative embodiments, the processor 124 assigns each of the testing programs to more than one wafer of the batch of wafers.

In some embodiments, the testing programs are configured to conduct different tests to the wafers. In some embodiments, the testing programs include different testing algorithms configured to measure parameters of the wafers. For example, a first testing program of the testing programs includes a first plurality of testing algorithms, a second testing program of the testing programs includes a second plurality of testing algorithms, and the first and second pluralities of testing algorithms are different and configured to measure different parameters of the wafers.

In some embodiments, each of the batch of wafers is the same as each other. In some embodiments, the batch of wafers includes wafers with identical structure, circuit, and/or materials.

In some embodiments, each of the batch of wafers is different from each other. In some embodiments, the batch of wafers includes wafers with different structures, circuits, and/or materials. Because of the difference among the wafers, the wafers might require different tests to ensure their performance and functions. In such embodiments, assigning different testing programs to different wafers can cause the wafer system 100 to execute different testing programs to test different wafers in the later operations.

In some embodiments, the non-transitory computer-readable medium 122 is further configured to store data indicating the structures, circuits, materials, etc. of the wafers and data indicating the required tests for wafers having such structures, circuits, materials, etc. In some embodiments, the processor 124 is configured to access and process such data and assign the testing programs to the wafers. In other words, the processor 124 is configured to identify the corresponding testing program(s) for each wafer based on the information encompassed in such data and then assign the corresponding testing program(s) to each wafer.

In some embodiments, the processor 124 assigns a first testing program of the testing programs stored in the non-transitory computer-readable medium 122 to a first wafer of the batch of wafers and assigns a second testing program of the testing programs stored in the non-transitory computer-readable medium 122 to a second wafer of the batch of wafers.

In some embodiments, the processor 124 assigns a first testing program of the testing programs stored in the non-transitory computer-readable medium 122 to a first plurality of wafers of the batch of wafers and assigns a second testing program of the testing programs stored in the non-transitory computer-readable medium 122 to a second plurality of the wafers in the batch of wafers.

In some embodiments, the processor 124 is further configured to assign at least one algorithms of a testing program to a wafer of the batch when assign testing programs to wafers. Because one testing program can include multiple algorithms configured to measure different parameters of the wafer, the processor 124 can further decide which of the algorithms included in one program will be used to test the wafer when assigning the programs to the wafers. Therefore, in the embodiments where the first testing program includes a first plurality of testing algorithms and the second testing program includes a second plurality of testing algorithms, the processor 124 is further configured to assign at least one of the first plurality of testing algorithms to a first wafer and assign at least one of the second plurality of testing algorithms to a second wafer.

Next, the processor 124 is configured to set multiple sets of testing conditions for the testing programs. In some embodiments, each of the sets of testing conditions corresponds to one of the testing programs.

In some embodiments, the processor 124 is configured to access the sets of testing conditions stored in the non-transitory computer-readable medium 122 and set the sets of testing conditions for the testing programs after the processor 124 assigns the testing programs to the wafers. For example, in the embodiments where the first testing program is assigned to the first wafer and the second testing program is assigned to the second wafer, the processor 124 is further configured to set a first set of testing conditions for the first testing program and set a second set of testing conditions for the second testing program.

In some embodiments, the processor 124 is further configured to assign multiple sets of testing sites to the wafers. For example, the processor 124 is configured to assign a first set of testing sites to a first wafer and assign a second set of testing sites to a second wafer. The sets of testing sites are configured to indicate at least one die of one of the wafers. In other words, the sets of testing sites are configured to show which dies of a wafer should be tested.

After the processor 124 assigns the testing programs to the wafers, sets the testing conditions for testing programs, and assigns the testing sites to the wafers, the processor 124 starts to execute the testing programs stored in the non-transitory computer-readable medium 122 according to the corresponding testing conditions and testing sites.

In the embodiments where at least one of the first plurality of testing algorithm is assigned to the first wafer and at least one of the second plurality of testing algorithm is assigned to the second wafer, the processor 124 can be further configured to measure at least one first parameter of the first wafer by executing the at least one of the first plurality of testing algorithms and measure at least one second parameter of the second wafer by executing the at least one of the second plurality of testing algorithms.

In the embodiments where the first set of testing conditions is set for the first testing program and the second set of testing conditions is set for the second testing program, the processor 124 can be further configured to test the first wafer by executing the first testing program according to the first set of testing conditions and test the second wafer by executing the second testing program according to the second set of testing conditions.

When the processor 124 executes the testing programs, the test head 128 of the tester 120 then tests the wafer WAF through the probe card PBC according to the testing programs being executed.

In the embodiments where the processor 124 assigns the first testing program to the first wafer and assigns the second testing program to the second wafer, the test head 128 can be further configured to measure at least one first parameter of the first wafer according to the first testing program and measure at least one second parameter of the second wafer according to the second testing program.

In the embodiments where the processor 124 assigns the first set of testing sites to the first wafer and assigns the second set of testing sites to the second wafer, the test head 128 can be further configured to measure at least one first parameter of the first wafer according to the first set of testing sites and measure at least one second parameter of the second wafer according to the second set of testing sites.

Figure 3A:
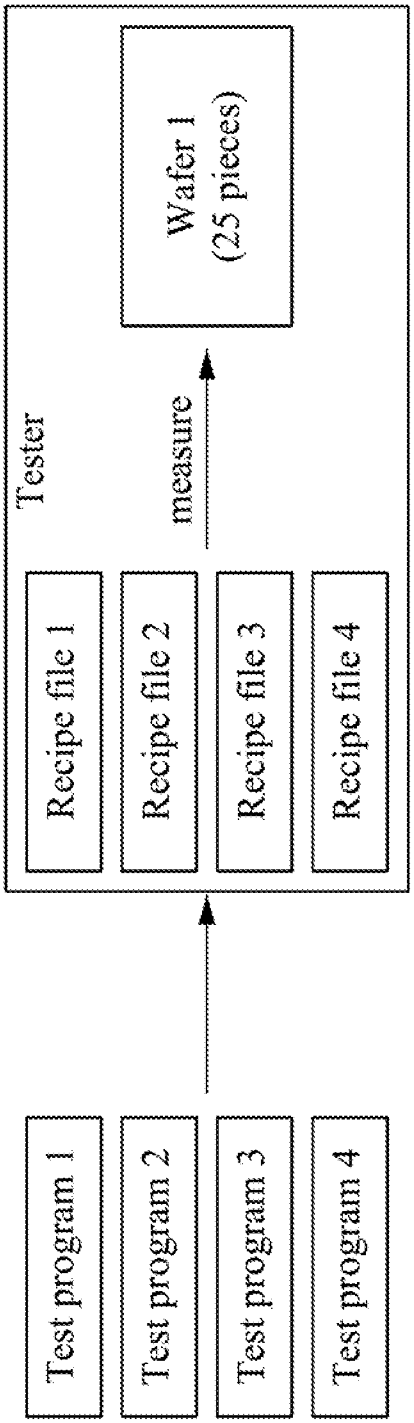
FIG. 3A is a diagram illustrating executing test programs according to recipe files in order to test wafers in accordance with some embodiments of the present disclosure.
Figure 3B:
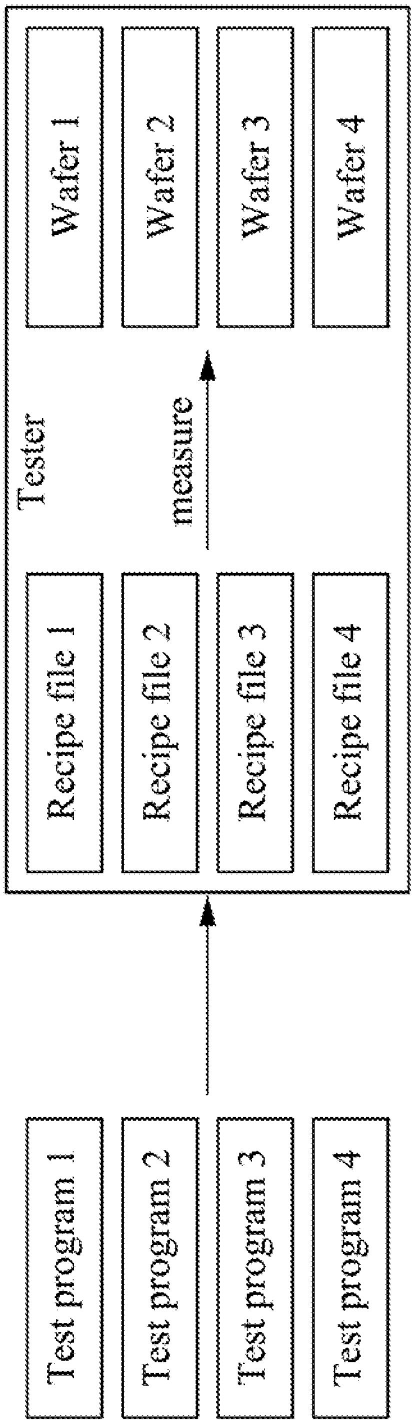
FIG. 3B is a diagram illustrating executing test programs according to recipe files in order to test wafers in accordance with some embodiments of the present disclosure.

The operations of the wafer testing system 100 can also be explained through FIG. 3A and FIG. 3B. FIG. 3A and FIG. 3B are diagrams illustrating executing test programs according to recipe files in order to test wafers in accordance with some embodiments of the present disclosure.

Please refer to FIG. 1 and FIG. 3A. In the embodiments of FIG. 3A, four testing programs (i.e., test programs 1-4 as shown in FIG. 3A) are stored in the non-transitory computer-readable medium 122 and are configured to test a batch of the same wafers (i.e., 25 pieces of wafers 1 as shown in FIG. 3A). In some embodiments, the processor 1-4 assigns the test programs 1-4 to the 25 pieces of the wafers 1. For example, the test program 1 is assigned to the first piece of the wafers 1, the test program 2 is assigned to the fifth piece of the wafers 1, the test program 3 is assigned to the tenth piece of the wafers 1, and the test program 4 is assigned to the fifteenth piece of the wafers 1. In this example, staff responsible for testing the wafers can pick specific wafers of the batch of wafers to be tested by specific programs, instead of testing all 25 pieces of the batch by executing all 4 testing programs respectively. It is worth noting this example is merely exemplary and does not intend to limit the present disclosure.

4 recipe files (i.e., recipe files 1-4) are also shown in FIG. 3A. In some embodiments, these recipe files include the sets of testing conditions and/or the sets of testing cites discussed above, and each of the recipe files 1-4 corresponds to one of the test programs 1-4.

Thus, as shown in FIG. 3A, the tester 120 can execute the test programs 1-4 according to the corresponding recipe files 1-4 to measure parameters of the 25 pieces of the wafers 1.

Please refer to FIG. 1 and FIG. 3B. In the embodiment of FIG. 3B, unlike the embodiment of FIG. 3A, different wafers (i.e., wafers 1-4) are to be tested by the tester 120. In other words, the wafers 1-4 represent wafers with different circuits, structure, materials, etc. In such embodiment, the test programs 1-4 can be assigned and used to test different wafers. For example, the test program 1 is assigned to the wafer 1, the test program 2 is assigned to the wafer 2, the test program 3 is assigned to the wafer 3, and the test program 4 is assigned to the wafer 4. Thus, the tester 120 can execute the test program 1 according to the corresponding recipe file 1 to measure parameters of the wafer 1, execute the test program 2 according to the corresponding recipe file 2 to measure parameters of the wafer 2, and so on. It is worth noting this example is merely exemplary and does not intend to limit the present disclosure.

Figure 2:
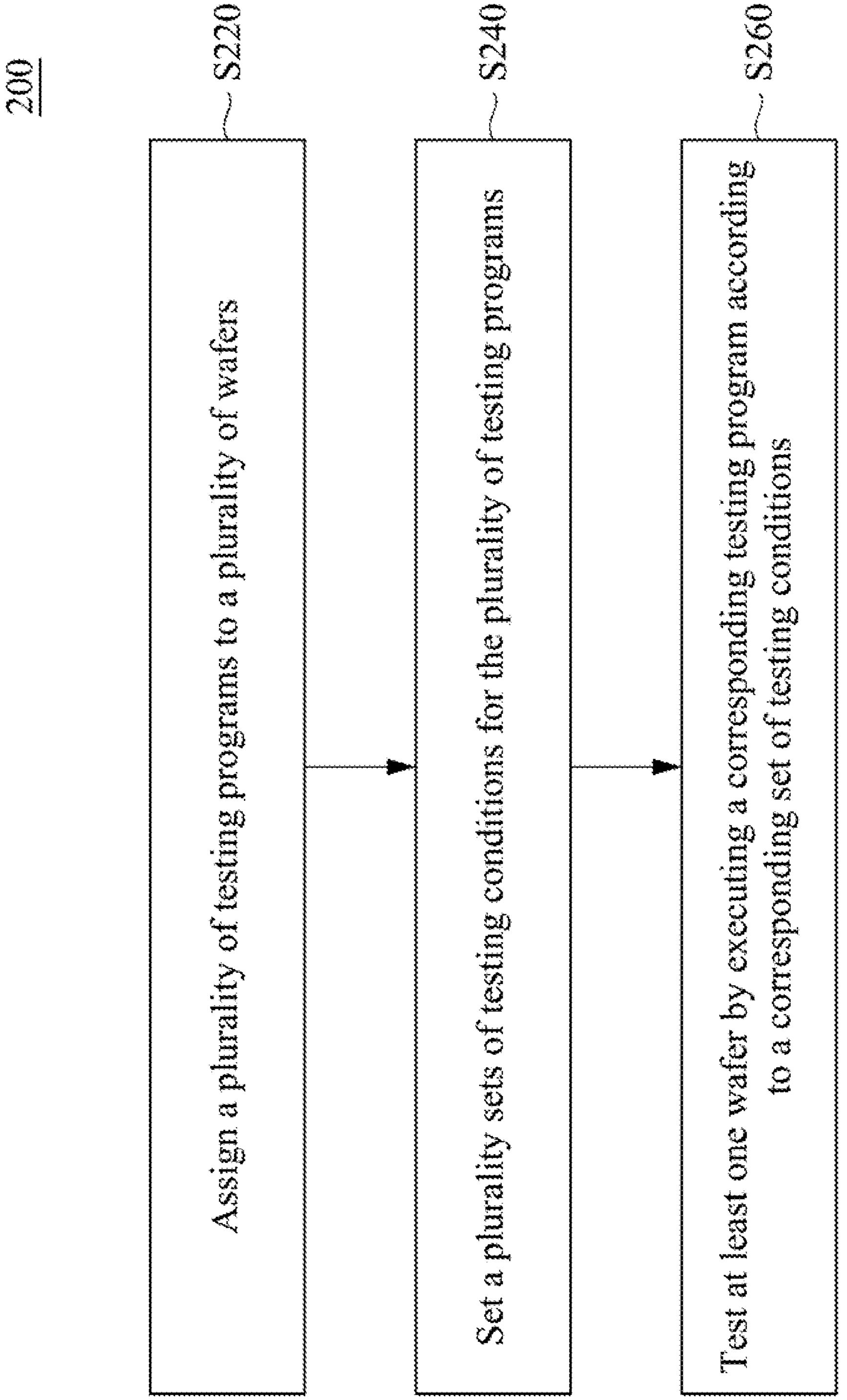
FIG. 2 is a flowchart of a wafer testing method in accordance with some embodiments of the present disclosure.

The present disclosure also provides a wafer testing method. FIG. 2 illustrates a flowchart of a wafer testing method 200 in accordance with some embodiments of the present disclosure. The wafer testing method 200 includes steps, S220, S240, and S260.

Steps of the wafer testing method 200 can be implemented or accomplished through the wafer testing system 100 and its components.

At step S220, the processor 124 assigns multiple testing programs stored in the non-transitory computer-readable medium 122 to multiple wafers, as previous embodiments describe.

In some embodiments, assigning the testing programs to the wafers includes assigning a first testing program of the testing programs to a first wafer of the of wafers and assigning a second testing program of the testing programs to a second wafer of the wafers.

In some embodiments, the first testing program comprises a first plurality of testing algorithms, the second testing program comprises a second plurality of testing algorithms, and the first plurality of testing algorithms and the second plurality of testing algorithms are different from each other.

In some embodiments, assigning the first testing program to the first wafer includes assigning at least one of the first plurality of testing algorithms to the first wafer and assigning the second testing program to the second wafer includes assigning at least one of the second plurality of testing algorithms to the second wafer.

At step S240, the processor 124 sets multiple sets of testing conditions stored in the non-transitory computer-readable medium 122 for the testing programs, as previous embodiments describe.

In some embodiments, setting the sets of testing conditions for the testing programs includes setting a first set of testing conditions for the first testing program and setting a second set of testing conditions for the second testing program.

At step S260, the processor 124 tests the wafers by executing the corresponding testing programs. In the embodiments where the processor 124 is configured to set the sets of testing conditions for the testing programs, the testing programs are executed according to the corresponding sets of testing conditions.

In some embodiments, testing the wafers by executing the corresponding programs includes measuring at least one first parameter of the first wafer by executing the at least one of the first plurality of testing algorithms and measuring at least one second parameter of the second wafer by executing the at least one of the second plurality of testing algorithms.

In some embodiments, testing the wafers by executing the corresponding programs includes testing the first wafer by executing the first testing program according to the first set of testing conditions and testing the second wafer by executing the second testing program according to the second set of testing conditions.

In some embodiments, the wafer testing method 200 further includes assigning multiple sets of testing sites to the wafers, and each of the sets of testing sites indicates at least one die of one of the wafers.

In conclusion, through the wafer testing system 100 and the wafer testing method 200 disclosed herein, wafers of a batch can be tested more efficiently. Different testing programs and testing sites can be assigned to different wafers, and the tester 120 and prober 140 can test the wafers accordingly. In some examples, tester can run only one testing program to test all wafers of a batch. In such examples, tester will spend plenty of time on measuring unnecessary parameters of wafers, and thus the efficiency is low.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A wafer testing method, comprising:

assigning a plurality of testing programs to a batch of wafers in a same wafer testing stage, wherein each of the plurality of testing programs comprises testing algorithms configured to measure parameters of the batch of wafers;

setting a plurality sets of testing conditions for the plurality of testing programs; and testing at least one of the batch of wafers by executing a corresponding one of the plurality of testing programs according to a corresponding one of the plurality sets of testing conditions, wherein assigning the plurality of testing programs to the batch of wafers comprises:

assigning a first testing program of the plurality of testing programs to a first wafer of the batch of wafers; and assigning a second testing program of the plurality of testing programs to a second wafer of the batch of wafers, wherein the second testing program is different from the first testing program, wherein the first testing program comprises a first plurality of testing algorithms, the second testing program comprises a second plurality of testing algorithms, and the first plurality of testing algorithms and the second plurality of testing algorithms are different from each other.

2. The wafer testing method of claim 1, wherein assigning the first testing program to the first wafer comprises assigning at least one of the first plurality of testing algorithms to the first wafer; and assigning the second testing program to the second wafer comprises assigning at least one of the second plurality of testing algorithms to the second wafer.

3. The wafer testing method of claim 2, wherein testing the at least one of the batch of wafers by executing the corresponding one of the plurality of testing programs comprises:

measuring at least one first parameter of the first wafer by executing the at least one of the first plurality of testing algorithms; and measuring at least one second parameter of the second wafer by executing the at least one of the second plurality of testing algorithms.

4. The wafer testing method claim 1, wherein setting the plurality sets of testing conditions for the plurality of testing programs comprises:

setting a first set of testing conditions for the first testing program; and setting a second set of testing conditions for the second testing program.

5. The wafer testing method claim 4, wherein testing the at least one of the batch of wafers by executing the corresponding one of the plurality of testing programs according to the corresponding one of the plurality sets of testing conditions comprises:

testing the first wafer by executing the first testing program according to the first set of testing conditions; and testing the second wafer by executing the second testing program according to the second set of testing conditions.

6. The wafer testing method of claim 1, further comprising:

assigning a plurality sets of testing sites to the batch of wafers, wherein each of the plurality sets of testing sites indicates at least one die of one of the batch of wafers.

7. A wafer tester, comprising:

a non-transitory computer-readable medium, configured to store a plurality of testing programs, a plurality sets of testing conditions, and a plurality sets of testing sites;

a processor, coupled to the non-transitory computer-readable medium, the processor configured to assign a first testing program of the plurality of testing programs to a first wafer of a batch of wafers and assign a second testing program of the plurality of testing programs to a second wafer of the batch of wafers in a same wafer testing stage, wherein the second testing program is different from the first testing program; and a test head, coupled to the processor;

wherein, in response to the processor executing the plurality of testing programs, the test head is configured to test the batch of wafers according to the plurality of testing programs, the plurality sets of testing conditions, and the plurality sets of testing sites;

each of the plurality of testing programs comprises testing algorithms configured to measure parameters of the batch of wafers, the first testing program comprises a first plurality of testing algorithms, the second testing program comprises a second plurality of testing algorithms, and the first plurality of testing algorithms and the second plurality of testing algorithms are different from each other;

each of the plurality sets of testing conditions corresponds to one of the plurality of testing programs; and each of the plurality sets of testing sites indicates at least one die of one of the batch of wafers.

8. The wafer tester of claim 7, wherein the test head is further configured to test the first wafer according to the first testing program and test the second wafer according to the second testing program.

9. The wafer tester of claim 7, wherein the processor is configured to assign the plurality sets of testing sites to the batch of wafers.

10. A wafer testing system, comprising:

a tester, comprising:

a non-transitory computer-readable medium configured to store a plurality of testing programs, a plurality sets of testing conditions, and a plurality sets of testing sites;

a processor, coupled to the non-transitory computer-readable medium and configured to assign the plurality of testing programs to a batch of wafers, comprising assigning a first testing program of the plurality of testing programs to a first wafer of the batch of wafers and assigning a second testing program of the plurality of testing programs to a second wafer of the batch of wafers in a same wafer testing stage, wherein the second testing program is different from the first testing program; and a test head, coupled to the processor; and a prober, comprising a probe card, wherein the probe card is coupled to the test head and configured to create an electrical path between the test head and at least one of the batch of wafers;

wherein the test head is configured to test the at least one of the batch of wafers through the probe card according to a corresponding one of the plurality of testing programs;

each of the plurality of testing programs comprises a plurality of testing algorithms configured to measure parameters of the batch of wafers, the first testing program comprises a first plurality of testing algorithms, the second testing program comprises a second plurality of testing algorithms, and the first plurality of testing algorithms and the second plurality of testing algorithms are different from each other;

each of the plurality sets of testing conditions corresponds to one of the plurality of testing programs; and each of the plurality sets of testing sites indicates at least one die of one of the batch of wafers.

11. The wafer testing system of claim 10, wherein the test head is further configured to measure at least one first parameter of the first wafer according to the first testing program and measure at least one second parameter of the second wafer according to the second testing program.

12. The wafer testing system of claim 10, wherein the processor is configured to assign a first set of testing sites of the plurality sets of testing sites to a first wafer of the batch of wafers and assign a second set of testing sites of the plurality sets of testing sites to a second wafer of the batch of wafers.

13. The wafer testing system of claim 12, wherein the test head is further configured to measure at least one first parameter of the first wafer according to the first set of testing sites and measure at least one second parameter of the second wafer according to the second set of testing sites.

* * * * *